United States Patent
Kim et al.

(10) Patent No.: US 9,525,578 B2
(45) Date of Patent: Dec. 20, 2016

(54) METHOD OF REDUCING PEAK-TO-AVERAGE POWER RATIO, CUBIC METRIC AND BLOCK ERROR RATE IN OFDM SYSTEMS USING NETWORK CODING

(75) Inventors: Yongho Kim, Anyang-Si (KR); Amin Alamdar Yazdi, Toronto (CA); Sameh Sorour, Toronto (CA); Shahrokh Valaee, Toronto (CA)

(73) Assignees: LG Electronics Inc., Seoul (KR); Amin Alamdar Yazdi, Toronto (CA); Sameh Sorour, Toronto (CA); Shahrokh Valaee, Toronto (CA)

( * ) Notice: Subject to any disclaimer, the term of this patent is extended or adjusted under 35 U.S.C. 154(b) by 306 days.

(21) Appl. No.: 13/642,423

(22) PCT Filed: Apr. 21, 2011

(86) PCT No.: PCT/KR2011/002897
§ 371 (c)(1),
(2), (4) Date: Apr. 15, 2013

(87) PCT Pub. No.: WO2011/132970
PCT Pub. Date: Oct. 27, 2011

(65) Prior Publication Data
US 2013/0198590 A1 Aug. 1, 2013

Related U.S. Application Data

(60) Provisional application No. 61/326,639, filed on Apr. 21, 2010.

(51) Int. Cl.
H04L 27/26 (2006.01)
H03M 13/37 (2006.01)
(Continued)

(52) U.S. Cl.
CPC .......... *H04L 27/2617* (2013.01); *H03M 13/05* (2013.01); *H03M 13/3761* (2013.01);
(Continued)

(58) Field of Classification Search
CPC .......................... H03M 13/258; H04L 1/0057
See application file for complete search history.

(56) References Cited

U.S. PATENT DOCUMENTS 5,408,502 A * 4/1995 How .............................. 375/340
6,381,713 B1 * 4/2002 Irvin et al. .................... 714/701
(Continued)

FOREIGN PATENT DOCUMENTS

JP 2010-57129 A 3/2010
KR 10-2003-0063665 A 7/2003

OTHER PUBLICATIONS

Jin Jin; Baochun Li; Taegon Kong, "Is Random Network Coding Helpful in WiMAX?," INFOCOM 2008. The 27th Conference on Computer Communications. IEEE, vol., No., pp.,, Apr. 13-18, 2008.*
(Continued)

*Primary Examiner* — Steve Nguyen
(74) *Attorney, Agent, or Firm* — Birch, Stewart, Kolasch & Birch, LLP

(57) ABSTRACT

Disclosed in a novel scheme to jointly reduce and trade-off Peak-to-Average Power Ratio (PAPR) and a Block Error Rate (BLER) using random network coding. To do this, the different representations of the input information block are generated using a special form of network coding matrices. Further, the encoded block puncturing is utilized to improve in the PAPR against a degradation in the BLER.

6 Claims, 6 Drawing Sheets

(51) Int. Cl.
*H03M 13/00* (2006.01)
*H04L 1/00* (2006.01)
*H03M 13/05* (2006.01)
*H03M 13/09* (2006.01)

(52) U.S. Cl.
CPC ... *H03M 13/6362* (2013.01); *H03M 13/6525* (2013.01); *H03M 13/6527* (2013.01); *H03M 13/6541* (2013.01); *H03M 13/6544* (2013.01); *H04L 1/0041* (2013.01); *H04L 1/0068* (2013.01); *H03M 13/09* (2013.01)

(56) References Cited

U.S. PATENT DOCUMENTS

| | | | |
|---|---|---|---|
| 6,701,135 B2 * | 3/2004 | Posti et al. | 455/103 |
| 6,732,325 B1 * | 5/2004 | Tash et al. | 714/785 |
| 7,151,804 B2 * | 12/2006 | Tong et al. | 375/260 |
| 7,345,990 B2 | 3/2008 | Son | |
| 2004/0264362 A1 * | 12/2004 | Rhodes | H04L 5/0046 370/208 |
| 2005/0249110 A1 * | 11/2005 | Huo et al. | 370/208 |
| 2006/0218459 A1 * | 9/2006 | Hedberg | 714/752 |
| 2006/0285602 A1 * | 12/2006 | Lim | 375/260 |
| 2007/0121483 A1 | 5/2007 | Zhang et al. | |
| 2008/0089333 A1 * | 4/2008 | Kozat et al. | 370/390 |
| 2008/0126916 A1 * | 5/2008 | Chung et al. | 714/801 |
| 2008/0304584 A1 * | 12/2008 | Nishio | H04L 1/0013 375/260 |
| 2009/0018849 A1 * | 1/2009 | Feder et al. | 705/1 |
| 2009/0274243 A1 | 11/2009 | Lee et al. | |
| 2010/0034186 A1 | 2/2010 | Zhou et al. | |

OTHER PUBLICATIONS

Ahlswede, R.; Aydinian, H., "On error control codes for random network coding," Network Coding, Theory, and Applications, 2009. NetCod '09. Workshop on, vol., No., pp. 68,73, Jun. 15-16, 2009.*

Zhu, X.; Zhu, G.; Jiang, T., "Reducing the peak-to-average power ratio using unitary matrix transformation," in Communications, IET, vol. 3, No. 2, pp. 161-171, Feb. 2009.*

Jie Huang et al., Nonbinary LDPC Coding for Multicarrier Underwater Acoustic Communication, IEEE Journal on Selected Areas in Communications, vol. 26, No. 9, Dec. 2008, pp. 1684-1696, XP011238897.

Jin Jin et al., "Adaptive Random Network Coding in WiMAX", IEEE International Conference on Communications, May 19-23, 2008, pp. 2576-2580, XP031265809.

Rong Zhang et al., Physical-layer Algebraic Network Coding and Superposition Coding for the Multi-Source Cooperation Aided Uplink; 2009 IEEE 69th Vehicular Technology Conference, Apr. 26-29, 2009, pp. 1-5, XP031474748.

* cited by examiner (a) Block diagram of transmitter (a) F = 64 subcarriers (b) F = 512 subcarriers (a) F = 64 subcarriers (b) F = 512 subcarriers (a) U = 4

(b) U = 8

(c) U = 12

METHOD OF REDUCING PEAK-TO-AVERAGE POWER RATIO, CUBIC METRIC AND BLOCK ERROR RATE IN OFDM SYSTEMS USING NETWORK CODING

CROSS REFERENCE TO RELATED APPLICATIONS

This application is the National Phase of PCT/KR2011/002897 filed on Apr. 21, 2011, which claims priority under 35 U.S.C. 119(e) to U.S. Provisional Application No. 61/326,639 filed on Apr. 21, 2010, all of which are hereby expressly incorporated by reference into the present application.

TECHNICAL FIELD

The present invention relates to jointly reduce and trade-off PAPR and BLER using random network coding in a wireless communication system.

BACKGROUND ART

A multicarrier transmission represents a direction that most state-of-the-art wireless communication standards evolve towards, including a Digital Video Broadcasting (DVB), IEEE 802.11, IEEE 802.16 and 3GPP Long Term Evolution (LTE) standards. A multicarrier modulation, such as orthogonal frequency division multiplexing (OFDM), is a well-known modulation scheme that has proven its efficiency in reliable data communications. Like any other technique, the OFDM encounters some challenges, one of which is its high peak-to-average power ratio (PAPR). The High PAPR requires a large power back-off in the transmitting amplifier, which translates to low power efficiency. Another metric quantifying the same problem is a cubic metric (CM), which provides a better prediction of the power capability than the PAPR. The use of the CM, as an evaluation metric, is proposed and adopted in the 3GPP standards. The lower the value of the CM provides more efficient the power amplifier performance. Therefore, a reducing the PAPR or the CM is a critical issue in portable wireless devices.

Another important challenge in wireless networks is to reduce a transmission error rate to effectively maximize the achievable throughput, even when unpredictable and time-varying block errors exist.

In a conventional art, large spectrum of techniques and algorithms have been developed to reduce PAPR and BLER separately. In current OFDM based networks, the source blocks are generally passed through BLER reduction algorithms, then the resulting streams are applied to PAPR reduction methods. However, improved works still be needed for simultaneously reducing both the PAPR and the BLER.

DISCLOSURE OF INVENTION

Solution to Problem

Therefore, in order to simultaneously reduce both the PAPR and the BLER, this disclosure may propose an improved scheme that different representations of the input information block are generated using a special form of network coding matrices. Further, this disclosure may further propose an additional step to trade off a further improvement in PAPR against a degradation in BLER using encoded block puncturing.

To achieve these and other advantages and in accordance with the purpose of the present invention, as embodied and broadly described herein, there is provided a method of transmitting data in wireless communication system, the method comprising: dividing an input bit stream into segments; adding error detection code into each segments of the divided input bit stream in order to generate a packet; dividing the generated packet into a plurality of blocks with fixed size; coding each of the plurality of block using a coefficient matrix in order to generate coded block bits, and transmitting the coded block bits.

To achieve these and other advantages and in accordance with the purpose of the present invention, as embodied and broadly described herein, there is also provided A method of transmitting data in wireless communication system, the method comprising: dividing an input bit stream into segments; adding error detection code into each segments of the divided input bit stream in order to generate a packet; dividing the generated packet into a plurality of blocks with fixed size; coding the plurality of blocks using a random network coding in order to generate a plurality of coded blocks; puncturing at least one coded block among the plurality of coded blocks; and transmitting the plurality of coded blocks, wherein the at least one punctured coded block is mapped to at least one multi-carrier.

The foregoing and other objects, features, aspects and advantages of the present invention will become more apparent from the following detailed description of the present invention when taken in conjunction with the accompanying drawings.

MODE FOR THE INVENTION

Figure 1:
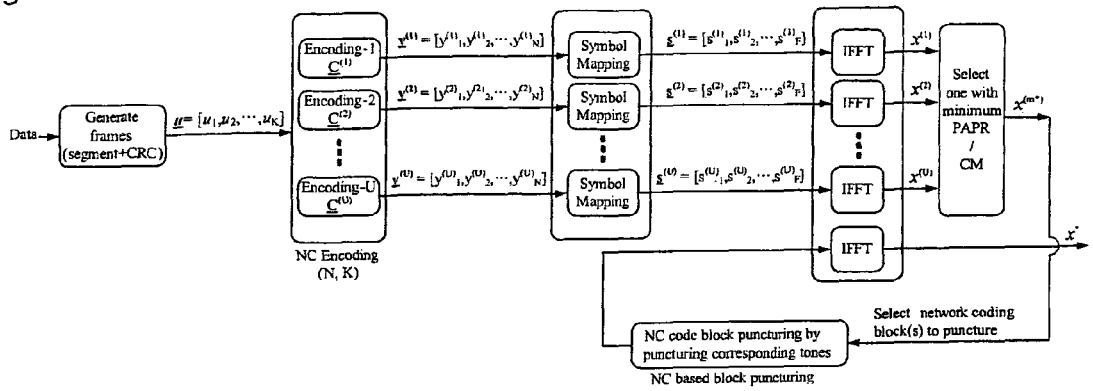
FIG. 1 shows an exemplary transmitting side block diagram of an improved PAPR reduction scheme using block-level RNC according to a present invention.

One aspect of this disclosure relates to the recognition by the present inventors about the problems of the related art as described above, and further explained hereafter. Based upon this recognition, the features of this disclosure have been developed.

Although this disclosure is shown to be implemented in a specific mobile communication system, this disclosure may also be applied to other communication systems operating in conformity with different standards and specifications.

Hereinafter, description of structures and operations of the preferred embodiments according to the present invention will be given with reference to the accompanying drawings.

As described above, different PAPR reduction approaches had been studied, such as distortion techniques (e.g., a clipping, a companding) and distortionless techniques (e.g., a systematic coding, selective coding, partial transmit sequence, tone injection/reservation, active constellation extension). Among others, the distortionless technique called selective mapping (SLM) has attracted much attention because of its effectiveness, strong PAPR reduction capabilities and low implementation complexities.

Also, forward error correction (FEC) techniques are employed as a solution for this problem to achieve reliable communications in wireless networks. In the physical layer, various FEC codes, such as convolutional codes, and turbo codes, can be employed. In current technology and its standards, data streams are divided into source blocks and each of these blocks is passed to an FEC processor to generate coded blocks that are more immune to channel errors. Thus, these coded blocks endure lower Block Error Rates (BLER) when transmitted over channels with unpredictable errors.

In another approach, a network coding has been originally proposed in information theory with the objective of maximizing network information flow, and has since emerged as one of the most promising information theoretic approaches for throughput improvement. The MAC layer Random Network Coding (MRNC) has been introduced to avoid the overhead problems incurred by a Hybrid Automatic Repeat reQuest (HARM). In the MRNC, the some packets of a given data frame are linearly combined with random non-zero coefficients, and the resulting coded packets are transmitted. Conditions for the minimum packet error rate in wireless channels may be derived when network coding is employed for error resilience. There is a protocol for co-operative packet recovery using symbol-level random network coding, which performs opportunistic routing on groups of correctly received symbols in a packet.

Although a network coding (NC) has been extensively studied, and its capability on multicarrier system is anticipated, the idea of employing it for joint PAPR/CM and BLER reduction has not yet been proposed. Consequently, this disclosure proposes a new scheme that employs NC to jointly reduce the PAPR/CM and BLER in multicarrier systems. This disclosure may consist of generating different sets of N coded blocks from a set of K source blocks (K<N) using a special form of network coding matrices, thereby achieving the minimum BLER. After symbol mapping and inverse fast Fourier transform (IFFT) of all these different sets, the signal with the lowest PAPR/CM may be selected. In other words, this disclosure may be viewed as a network coded. SLM (NC-SLM) scheme that employs specific network coding matrices, .instead of phase rotations, to generate different representations of the OFDM symbol, while minimizing the BLER. Consequently, this disclosure may be expected to achieve similar PAPR/CM as the C-SLM, while achieving the optimal BLER. Also, the new scheme of the present disclosure is a more general and practically implementable version of previous work, where a joint reduction of PAPR and symbol loss rate was proposed in multicarrier system. In contrast to the physical modulation symbol-level NC, this disclosure proposes to use block-level network coding (NC) operation in order to overcome some limitations incurred by rigid structure using modulation symbol level operation. In this disclosure, a "block" is referred as a group of bits that are much larger and independent of the modulation-level symbols employed in the physical layer.

As aforementioned, in order to further reduce the PAPR or the CM, this disclosure proposes an additional step that exploits the addition of redundant coded blocks by NC to puncture some of them. This additional step may consist of finding and puncturing the coded blocks that will result in the maximum PAPR/CM reduction. This step may be referred as the block puncturing step. The execution of this step may achieve a better PAPR/CM reduction, compared to C-SLM, at the cost of BLER performance degradation. Consequently, this step can be optionally used to further reduce the PAPR/CM when the first step fails in achieving the target PAPR/CM value.

A detailed description of the Peak-to-Average Power Ratio (PAPR) will be given as following.

Let $s=[s_1, s_2, \ldots, s_F]$ be a modulated data sequence of length F during the time interval [0, T], where s, is a symbol from a signal constellation, F is the number of OFDM data subcarriers and T is the OFDM symbol duration. The complex baseband representation of the transmit signal can thus be formulated as:

$$x(t) = \sum_{i=1}^{F} s_i \cdot \exp(j2\pi f_i t), \; 0 \le t \le T \qquad (1)$$

where $j=\sqrt{-1}$. The PAPR of x(t) is defined as:

$$PAPR = \frac{\max_{0 \le t \le T} |x(t)|^2}{\frac{1}{T}\int_0^T |x(t)|^2 dt} \qquad (2)$$

A major drawback of the PAPR metric is that it does not take into account the secondary peaks of power that considerably affect the power amplifier performance due to the cubic term in the amplifier gain characteristic function defined as:

$$x_o(t) = G1 \cdot (x_i(t) + G3 \cdot x_i(t)|^3) \qquad (3)$$

where xi(t) and xo(t) are the amplifier's input and output voltages, respectively.

A detailed description of the Cubic Metric (CM) will be given as following.

In order to get, a better prediction (than the PAPR) of the power capability (de-rating) of a given power amplifier on an input signal, the CM has been adopted by the 3GPP. The CM of a signal is defined as:

$$CM = \frac{RCM - RCM_{ref}}{K_{CM}} \qquad (4)$$

where $K_{CM}$ is an empirical slope factor, RCM is called the "Raw Cubic Metric" and RCMref is the raw cubic metric of the Wideband Code Division Multiple Access (WCDMA) voice reference signal. RCM is defined for a signal x(t) by:

$$RCM = 20 \log\left(RMS\left(\left(\frac{|x(t)|}{RMS(x(t))}\right)^3\right)\right) \qquad (5)$$

where RMS is the root mean square value. Since $RCM_{ref}$ and $K_{CM}$ are constant values, RCM can be used as a performance metric. In the present disclosure, both PAPR and CM may be utilized as performance metrics.

A detailed description of the Conventional Selective Mapping (C-SLM) will be given as following.

Selective mapping can be simply defined as the process of generating different output representations of the input data sequence to a multicarrier modulator, using predefined phase rotation sequences, and selecting the representation that achieves the lowest PAPR for transmission. Let $\Phi(m)=[\phi_1^{(m)}, \ldots, \phi_F^{(m)}]$, $1 \leq m \leq U$, be pre-fixed phase sequences. Thus, U representations of the modulated data sequence s can be obtained as follows:

$$\Phi(m)=[\Phi_1^{(m)}, \ldots, \Phi_F^{(m)}], 1 \leq m \leq U, s_i^{(m)}=s_i \cdot e^{j\phi_i(m)} \quad (6)$$

In other words, $s_i^{(m)}$ is a phase rotated version of $s_i$. After applying IFFT to these U versions using the equation (1), their PAPR can be computed using the equation (2), respectively. The C-SLM then may select to transmit the version that achieves the lowest PAPR among these U PAPRs.

A detailed description of the Symbol-Level vs Block-Level Network Coding will be given as following.

The Symbol-level NC is performed over symbols at the physical layer. In the present disclosure, the term "symbol" is used to describe the unit of data that is defined by the modulation scheme in the physical layer. For example, one symbol represents two bits if Quadrature Phase Shift Keying (QPSK) is used, and four bits if 16 Quadrature Amplitude Modulation (QAM) is used. In some operation, symbol-level NC was performed on modulation symbols. In such operation, the size of the NC block is selected to be the same as the number of bits represented by the employed modulation level. Therefore, the coding operations are done using a finite field with dimension related to the employed modulation level. For example, in case of 16-QAM, Galois Field (GF(24)) is used for the encoding/decoding operation and 4 bit block size is selected for efficient and simple finite field operation. One coded block, which represents one modulation symbol, is mapped to one subcarrier.

In the present disclosure, it is proposed to employ block-level NC operations instead of modulation symbol based operations. This may provide more flexibility and adaptability, while still taking the full benefits of modulation symbol based NC. The main advantages of block-level NC over symbol-level NC may be described as following:

Flexibility: Block and finite field sizes can be flexibly changed, since block partitioning can be performed irrespective of modulation. In symbol-level NC, when the modulation scheme is changed due to varying channel conditions, the block and finite field sizes should be changed which result in performance degradation because blocks encoded with different finite fields cannot be decoded.

Adaptability: Since the operating finite field and block size selection do not depend on a given modulation scheme, they can be adaptively selected with taking varying channel conditions into account.

A detailed description of a new scheme to jointly reduce PAPR/CM and BLER according the present disclosure will be given as following.

Figure 2:
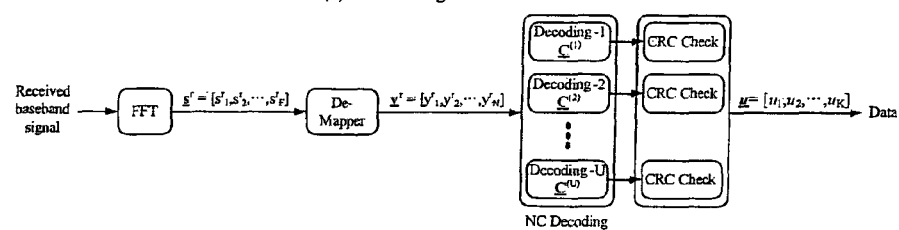
FIG. 2 shows an exemplary receiving side block diagram of the improved PAPR reduction scheme using block-level RNC according to the present invention.

The core of this new scheme may consist of a network coded SLM (NC-SLM) approach (instead of C-SLM), in which different NC matrices are used to generate different representations of the OFDM symbol. The employed coding matrices are designed so as to minimize the BLER. For further PAPR/CM reduction, the present disclosure may introduce a block puncturing step, which reduces PAPR/CM at the expense of some BLER performance degradation. FIG. 1 and FIG. 2 show an exemplary transmitting/receiving side block diagram of an improved PAPR reduction scheme using block-level RNC according to a present invention.

A detailed description of a network coded block generation according to the present disclosure will be given as following.

At the physical layer, the transmitter divides the input bit stream into blocks with fixed size, each of which contains a certain number of physical layer symbols. Let K be the number of blocks that can be transmitted over one OFDM symbol after block encoding, and $u_i$ (i=1, 2, ..., K) as the i-th block in the OFDM symbol. Let $u=[u_1, u_2, \ldots, u_K]$ be the vector of original blocks in a single OFDM symbol.

After block partitioning, the original block vector $\underline{u}$ is passed to network coding units, each encoding the K blocks of $\underline{u}$ into N coded blocks (N>K). Let $A^{(m)}=[a_{ij}^{(m)}]$ (i ∈ {1, ..., K}, j ∈ {1, ..., N}, m ∈ {1, ..., U}) be the coding matrix of the m-th unit. The elements of $A^{(m)}$ are chosen from a Galois field (GF), whose size is determined by the number of bits per block (e.g. for a block of 8 bits, $GF(2^8)$ should be used). Each coded block $y_j^{(m)}$, j ∈ {1, ..., N} can then be generated as follows:

$$y_j^{(m)} = \sum_{i=1}^{K} u_i a_{ij}^{(m)} \quad (7)$$

In other words, each coded block is a linear combination of a subset or all of the original data blocks. Consequently, the 1×K vector of original blocks is encoded into a 1×N vector of coded blocks in the m-th coding unit as:

$$\underline{y}^{(m)}=[y_1^{(m)}, y_2^{(m)}, \ldots, y_N^{(m)}]=\underline{u} \cdot A^{(m)} \quad (8)$$

The code rate (r) of this process is r=K/N. Any K of these coded blocks can be used at the receiver to decode the original K blocks by inverting the sub-matrix of coding coefficients corresponding to these K blocks.

Each generated coded block can be mapped to one or several modulation symbols. The required number of symbols for one coded block depends on the size of the coded block and the selected modulation scheme. For example, a coded block with a block size of 8 bits is mapped to four symbols for QPSK and two symbols for 16QAM. In the present disclosure, it is assumed that the number N of coded blocks and their size should be determined so that they are loaded on the subcarriers of one OFDM symbol using the employed modulation level. For example, assuming a code rate of ½, 16-QAM, a block size of 8 bits, and 64 data subcarriers, the numbers of original and coded blocks should be set to N=32 and K=16, respectively. Thus, a 128-bit data segment is required to generate each original block vector.

In order to reduce the overhead of communicating coding coefficients between the transmitter and the receiver for each coded block, the coding coefficient matrices can be pre-generated and kept at the transmitter and the receiver. These pre-generated coding matrices should have the ability to minimize the BLER.

A detailed description of a coefficient Matrix generation according to the present disclosure will be given as following.

In order to design matrices that minimize the BLER, the following characteristic matrix is adapted:

$$C = X(A): \begin{cases} c_{ij} = 1 & \text{if } a_{ij} \neq 0 \\ c_{ij} = 0 & \text{if } a_{ij} = 0 \end{cases}$$

where $a_{ij}$ and $c_{ij}$ are the corresponding entries of matrices A and C, respectively. In order to minimize the BLER, the following theorem may be used Theorem 1: For practical values of bit-error-rate on a channel, a coding matrix A achieves the minimum block error rate and consequently maximum reliability if its characteristic matrix C=X(A) has the form:

$$C = [I_K | E_{K \times (N-K)}] \quad (9)$$

where $I_K$ is the K×K identity matrix and $E_{K \times (N-K)}$ is the K×(N−K) all ones matrix.

In order to guarantee a successful decoding, any K×K sub-matrix of the coefficient matrix A should be nonsingular. The following theorem 2 introduces a method to guarantee this property for A, while obeying the condition in Theorem 1.

Theorem 2: The coefficient matrix A defined as.

$$A = \begin{pmatrix} 1 & 0 & \cdots & 0 & v_1 & v_2 & \cdots & v_{N-K} \\ 0 & 1 & \cdots & 0 & v_1^2 & v_2^2 & \cdots & v_{N-K}^2 \\ \vdots & \vdots & \ddots & \vdots & \vdots & \vdots & \vdots & \vdots \\ 0 & 0 & \cdots & 1 & v_1^K & v_2^K & \cdots & v_{N-K}^K \end{pmatrix}$$

satisfies the conditions of Theorem 1 and guarantees the nonsingularity of any K of its columns, iff (if and only if) for $v_i \in GF(2^n)$, we have $v_i \neq v_j$, for i, j ∈ {1, . . . , $2^n-2$}, where $2^n-2 \geq N-K$, GF is a Galois field or finite field, N is a number of coded blocks associated with K blocks of the input bit stream that can be transmitted over one OFDM symbol after block encoding, n is a number of bits per block, K is a total number of rows, and N-K is a total number of columns.

It has been proved that the two vectors, $v1=[v_1, v_1^2, \ldots, v_1^{n-1}]$ and $v2=[v_2, v_2^2, \ldots, v_2^{n-1}]$, v1, v2 ∈ $GF(2^n)$ and v1≠v2, are linearly independent. This is due to the following facts:

For $x \in GF(2^n)$ and x≠1, the two terms $x^{n_1}$ and $x^{n_2}$ are not equal when $n_1 \neq n_2$, $n_1$, $n_2 \in \{0, 1\}$, and $n_1$, $n_2 \leq n-1$.

For $x_1, x_2 \in GF(2^n)$ and $x_1, x_2 \neq 1$, the two terms $x_1 i$ and $x_2'$ are not equal when $x_1 \neq x_2$, and $1 \leq i \leq n-1$.

Therefore, any K×K sub-matrix of A is nonsingular.

By combining available coefficient matrices, different coefficient matrices can be created to generate different OFDM transmit signals.

A detailed description of a network coded Selective Mapping Scheme (NC-SLM) according to the present disclosure will be given as following.

Based on the above coding procedures and coefficient matrices design, the original block vector u is passed to U network coding units, each using a realization of the coding matrix explained in the Theorem 2. The output of these U units is U different vectors of coded blocks, $[\underline{y}^{(1)}, \underline{y}^{(2)}, \ldots, \underline{y}^{(U)}]$, each of size N blocks, from the original K blocks of $\underline{u}$. Each coded block vector is mapped to a modulation symbol vector $\underline{s}^{(m)}=[s_1^{(m)}, s_2^{(m)}, \ldots, s_F^{(m)}]$, 1≤m≤U. The length of each symbol $s_1^{(m)}$ is Q=$\log_2(M)$, where M is the employed modulation level. After IFFT of these U candidate symbol streams into U candidate transmit signals $x^{(m)}$ (1≤m≤U), the transmitter selects the signal x* with the lowest PAPR or CM, for transmission or forwarding to the block puncturing step of the proposed scheme of the present disclosure.

The U different coding matrices, employed in the above process, may be pre-set and pre-stored in both the transmitter and the receiver. Consequently, the transmitter does not need to transmit the index of the selected coding matrix. Instead, the receiver tries to decode the received signal, after FFT and symbol de-mapping, using the pre-stored U different matrices. After decoding the incoming bit sequence using these pre-stored U different matrices, the Cyclic Redundancy Check's (CRC's) of the decoded frames are examined and the frame that passes the CRC check is selected as the correctly received frame. If none of the decoded frames using U different matrices passes the CRC check, then the frame is discarded at the physical layer without delivering it to upper layers because this frame has errors. A similar strategy may be employed for HARQ in various air interface standards including IEEE 802.16 WiMAX and 3GPP LTE.

The NC-SLM scheme may use U different coefficient matrices to generate symbol sequences, whereas the C-SLM may use U different phase sequences to generate symbol sequences. In order to compare complexity between the NC-SLM and the C-SLM, the differences between the two schemes should be investigated. The major difference is where multiplication operation takes place. For the NC-SLM, multiplication operations are done at the bit level before symbol mapping. However, the multiplication operations in the C-SLM takes place at symbol level after symbol mapping. Therefore, the complexity of the proposed NC-SLM scheme is the same as or less than the C-SLM.

The following is a context for the network coded selective mapping algorithm. This algorithm illustrates the summarized procedure of the NC-SLM algorithm. The processes in the FOR loop can be performed in parallel of the FIG. 1.

Algorithm 1 Network Coded Selective Mapping Algorithm

Require: F, U, Q, r, n

SET Operation field to GF(2n)

DIVIDE input bit streams into segments and append CRC to each segment, such that the size of the CRC appended segment is FQ DIVIDE the segment into K blocks $\underline{u}=[u_1 u_2, \ldots, u_K]$, each of size n form=1 to U do $\underline{y}^{(m)}=\underline{u} \times \underline{A}^{(m)}$ GENERATE its corresponding baseband representation signal, $x^{(m)}$ from equation (1)

CALCULATE $PAPR_m$ from equation (2) OR $CM_m$ from equations (4) and (5)

end for m*=$\text{argmin}_m$ {$PAPR_m$} OR m*=argminm {$CM_m$}

TRANSMIT $x^{(m*)}$

A detailed description of a block puncturing according to the present disclosure will be given as following.

The block puncturing step is an additional step to proposed scheme of the present disclosure, which aims to further reduce PAPR/CM by iteratively finding and puncturing the blocks whose puncturing maximize the PAPR/CM reduction. The block puncturing is equivalent to not loading the corresponding tones. For example, if the block size is 8 bits, and the first block is selected for puncturing in a 16QAM-64 OFDM system, the first two tones conveying the first block (two 16QAM symbols) are not loaded with the symbols corresponding to this block.

The block puncturing is possible due to the design of proposed NC-SLM scheme in the present disclosure. From the equation (7), each transmitted block is a linear combination of the original blocks, and any combination of K transmitted blocks can re-construct the original blocks. Since there is redundancy in the system, some of the blocks may be dropped to reduce the PAPR, while still being able to recover the original blocks. This step will indeed increase the BLER. However, if the resulting BLER is below the targeted value, block puncturing may be plausible.

The ability of block puncturing in reducing the PAPR can be justified using a large deviation theory. From equation (1), the instantaneous power of the OFDM symbol x(t) at time t is given by $$|x(t)|^2 = \sum_{i=1}^{F} |s_i|^2 + \sum_{i=1}^{F} \sum_{k=i+1}^{F} 2\Re\{s_i s_k^* \cdot \exp\{j2\pi(f_i - f_k)t\}\}, \quad (10)$$
$$0 \leq t \leq T$$

Let us define $$\gamma_{ik}(y) = 2\Re\{s_i s_k^* \cdot \exp\{j2\pi(f_i - f_k)t\}\} \quad (11)$$

Then the equation (10) can be written as $$|x(t)|^2 = z(t) = \sum_{i=1}^{F} |s_i|^2 + \sum_{i=1}^{F} \sum_{k=i+1}^{F} \gamma_{ik}(t) \quad (12)$$

It is assumed that si and sk are independent for i≠k. Therefore, for very large values of F, the process z(t) has the mixing property, which indicates that the theory of large deviation holds for z(t). This claim can also be verified by noting that PAPR has a distribution with exponential tail. Using the theory of large deviation, we have $$P\left(\max_t z(t) > \eta\right) \approx \max_t P(z(t) > \eta) \quad (13)$$

Let m=F(F+1)/2 be the total number of terms in the summation (12). Using the Chernoff bound, we get $$\max_t P(z(t) > \eta) = e^{-ml(\frac{\eta}{m})} \quad (14)$$

where I(.) is the rate function.

The block puncturing is performed by setting some of the si's equal to zero. Let zp(t) be the power of the induced signal at time instant t when the pth tone is punctured, that is $$|x_p(t)|^2 = z_p(t) = \sum_{i=1 \neq p}^{F} |s_i|^2 + \sum_{i=1 \neq p}^{F} \sum_{k=i+1 \neq p}^{F} \gamma_{ik}(t) \quad (15)$$

The total number of terms in the summation is n=m−F. Therefore, the Chernoff bound for $z_p(t)$ can be given by $$\max_t P(z_p(t) > \eta) = e^{-nl(\frac{\eta}{n})} \quad (16)$$

Consequently, $$\frac{\max_t P(z_p(t) > \eta)}{\max_t P(z(t) > \eta)} = e^{-nl(\frac{\eta}{n}) + ml(\frac{\eta}{m})} \quad (17)$$

From the theory of large deviation, it is known that for $\eta/m > E[z(t)]$, the rate function is a convex increasing function of its argument. Given that n<m, we have $nI(\eta/n) > mI(\eta/m)$, and therefore $$\max_t P(z_p(t) > \eta) < \max_t P(z(t) > \eta) \quad (18)$$

In other words, puncturing results in PAPR reduction.

In the above analysis, it is assumed that the average power does not change after puncturing. In practice, since the maximum power tones are usually removed, the average power is also reduced. However, since the average power changes linearly while maximum power changes exponentially, the effect of the latter factor is more substantive.

A detailed description of a selection of punctured blocks according to the present disclosure will be given as following.

The punctured blocks are selected in an iterative procedure. During the first iteration, one of the N coded blocks is punctured at a time and the PAPRs/CMs of the resulting signals are measured and compared. Let $x_j(t)$, $(1 \leq j \leq N)$ be the signal (after IFFT) having the j-th block punctured. The corresponding PAPR (denoted by $PAPR_j$) can be formulated as:

$$PAPR_j = \frac{\max_{0 \leq t \leq T} |x_j(t)|^2}{\frac{1}{T} \int_0^T |x_j(t)|^2 dt} \quad (19)$$

Similarly, we can formulate the corresponding CM (denoted by $CM_j$) as:

$$CM_j = \frac{RCM_j - RCM_{ref}}{K_{CM}} \quad (20)$$

where $$RCM_j = 20 \log\left(RMS\left(\left(\frac{|x_j(t)|}{RMS(x_j(t))}\right)^3\right)\right) \quad (21)$$

After measurement and comparison of the PAPRs/CMs, the block j* that must be punctured is chosen as follows:

$$j^* = \arg\min_j \{PAPR_j\} \quad (22)$$

OR $$j^* = \arg\min_j \{CM_j\}$$

After the actual puncturing of the j*-th block, the new signal $x_{j^*}(t)$ is used to find a next puncturing block (i.e. the previous iteration is re-executed with $x_j^*(t)$ as input). These iterations continue until a predefined number of iterations ($N_p$) is reached.

The complexity of search in this step is O ($[N-N_p+1] \times N_p$). However, the $N_p$ is recommended to be a small number considering the tradeoff between PAPR reduction efficiency and error correction performance degradation. Therefore, the complexity of the search for the punctured blocks is within the practical limits.

When this step is executed at the transmitter, the receiver employs the same method described in the previous section for frame reception. Note that the transmitter need not inform the receiver of the punctured block locations, since they can be identified at the receiver by energy detection. Low energy symbols result in low log likelihood ratio (LLR) in the demodulation process. Thus, the blocks with low LLR values are avoided in the decoding process.

An important point is that this puncturing process reduces the number of alternatives to decode the original K blocks. This clearly leads to a performance degradation in terms of BLER. Consequently, the block puncturing step can be used as a supplementary procedure to acquire the desired PAPR/CM level, if this desired level is not reached after completing the main NC-SLM algorithm (illustrated in Algorithm 1).

The following is a context for the block puncturing step. This algorithm illustrates the summarized procedure of the proposed block puncturing step.

Algorithm 2 Block Puncturing Step
Require: $N_p$
COMPUTE $x^{(m^*)}$ from Algorithm 1
P←∅(P is the set of punctured blocks)
for i=1 to $N_p$ do
 for j=1 to N do
  if j ∉ P then
   PUNCTURE the j-th block
   GENERATE its corresponding baseband representation signal, $x_j$ from equation (1)
   CALCULATE $PAPR_j$ from equation (19) OR $CM_j$ from equations (20) and (21)
   RESTORE j-th block
  end if
 end for
 j*=argmin$_j$ {$PAPR_j$} OR j*=argmin$_j$ {$CM_j$}
 PUNCTURE block j*
 x*←$x_j$*
 P←P∪j*
end for
TRANSMIT x*

A detailed description of a PAPR-BLER trade-off according to the present disclosure will be given as following.

The BLER degradation resulting from block puncturing for PAPR reduction is analyzed as following. At the physical layer, one symbol contains several bits, and different bit positions of a constellation point may have different bit error probabilities. When the employed modulation level is M, the number of bits per symbol is Q=log$_2$ M. Let $P_M^q$, q=1, 2, ..., Q be the bit error probability of the qth bit. Thus, when the modulation level M is used, the block error probability of a block with size n bits can be formulated as $$P_{block} = 1 - \left(\prod_{i=1}^{Q}(1-P_M^i)\right)^{\frac{n}{Q}} \quad (23)$$

If the coefficient matrix A satisfies the conditions of the Theorem 1, a block is lost if the subcarriers loaded with that block are lost and at least K blocks are not received correctly from the remaining N-1 blocks. The modified block error probability (Pblock_loss) can be expressed in terms of the original block error rate (Pblock) as $$P_{block\_loss} = P_{block} \times \left(1 - \sum_{i=K}^{N-1}\binom{N-1}{i}(1-P_{block})^i P_{block}^{N-1-i}\right) \quad (24)$$

When blocks are punctured, the modified block error probabilities can be formulated into two forms depending on what kind of blocks are punctured. If the Np punctured blocks are all from the $I_K$ part of the coefficient matrix ($[I_K|E_{K^*(N-K)}]$), the modified block error probability ($P_{loss\_I}$) is:

$$P_{loss\_I} = 1 - \sum_{i=K}^{N-N_p-1}\binom{N-N_p-1}{i}(1-P_{block})^i P_{block}^{N-N_p-1-i} \quad (25)$$

If the $N_p$ punctured blocks are all from the $E_{K^*(N-K)}$ part of the coefficient matrix ($[I_K|E_{K^*(N-K)}]$), the modified block error probability ($P_{loss\_E}$) is:

$$P_{loss\_E} = P_{block} \times \left(1 - \sum_{i=K}^{N-N_p-1}\binom{N-N_p-1}{i}(1-P_{block})^i P_{block}^{N-N_p-1-i}\right) \quad (26)$$

It can be clearly seen from equations (25) and (26) that the block error rate of puncturing blocks generated by the $E_{K^*(N-K)}$ part is lower than the block error rate of puncturing blocks generated by the $I_K$ part. Therefore, the present disclosure recommends to puncture NC blocks generated by the $E_{K^*(N-K)}$ part of the coefficient matrices.

A simulation results according to the present disclosure will be given as following.

A useful metric to measure the effectiveness of PAPR reduction algorithms is the complementary cumulative distribution function (CCDF) of the PAPR, which is the probability that the PAPR of an OFDM symbol exceeds the threshold level PAPR$_0$, that is, CCDF(PAPR(x(t))=Pr(PAPR (x(t))>PAPR0)

Figure 3:
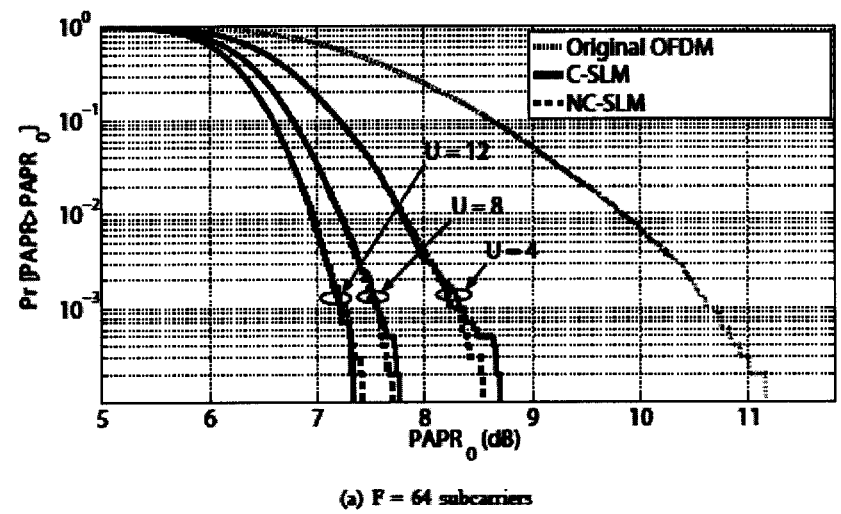
FIG. 3 shows a PAPR CCDF performance of the C-SLM scheme and the NC-SLM scheme without block puncturing for 16 QAM-OFDM signals.
Figure 3:
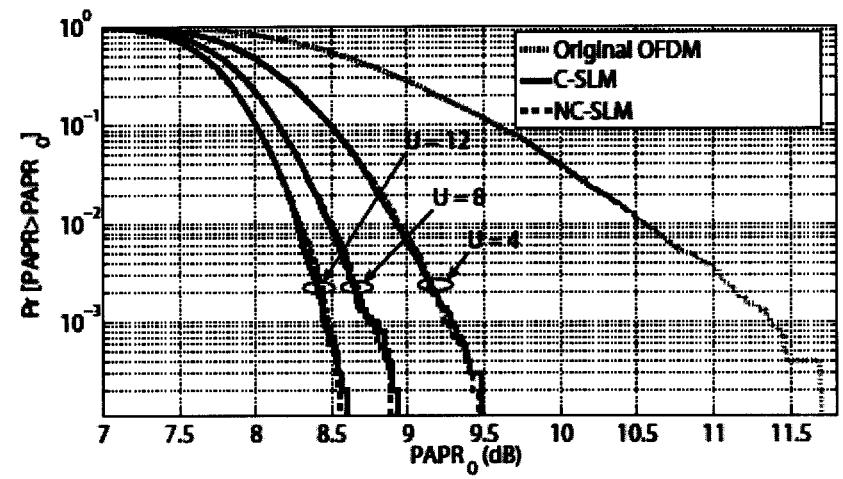

In the first simulation, the PAPR is obtained using U (4, 8, and 12) different phase sequences and coefficient matrices for the C-SLM and the proposed NC-SLM schemes, respectively. FIG. 3 depicts the CCDF performance of the C-SLM and the proposed NC-SLM schemes for 64 and 512 data subcarriers, when the algorithm is employed without block puncturing. In the simulation, data blocks fitting in one OFDM symbol are randomly generated and the OFDM signal is obtained with 16QAM symbol mapping and IFFT. With this setting, 10000 OFDM signals are simulated and the CCDF performance of PAPR is evaluated. The simulation results show that the proposed NC-SLM scheme achieves a performance similar to the C-SLM scheme. However, it is noted that the same PAPR performance is achieved in NC-SLM with minimum BLER.

Figure 4:
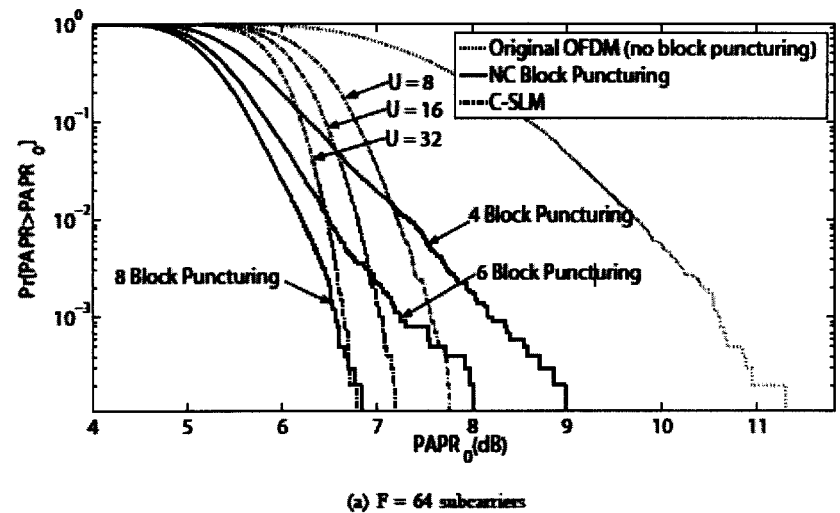
FIG. 4 shows a PAPR CCDF performance of the C-SLM scheme and the NC-SLM scheme with block puncturing for 16 QAM-OFDM signals.
Figure 4:
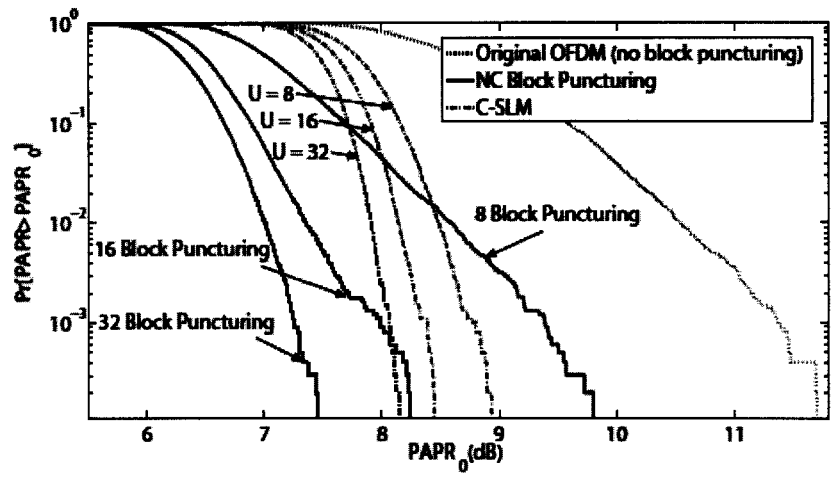

With the same simulation setting, the effect of block puncturing on PAPR has been studied. First, only block puncturing on an OFDM signal is simulated. That is, the block puncturing is done directly on the OFDM signal without the NC-SLM step. FIG. 4 shows the CCDF of the block punctured signal, for $N_p$=4, 6, and 8 in the 64-subcarrier setting and N $N_p$=8, 16, and 32 in the 512-subcarrier setting, where $N_p$ is the number of punctured blocks. As noticed, the block puncturing is an effective method for the PAPR reduction even without the use of the SLM technique. The CCDF of the PAPR for the C-SLM algorithm is also plotted in the FIG. 4. It is noted that the block puncturing can be more effective than SLM.

As noticed in the FIG. 4, the slope of the tail of CCDF decreases with the number of punctured blocks, which was predicted by the large deviation theory. Furthermore, when the number of data subcarriers increases, more coded block puncturing is required to achieve sufficient PAPR reduction (i.e. more blocks should be punctured for F=512 as compared to F=64). However, this increase in the number of punctured block does not affect the code rate. For example, when the code rate without block puncturing is ½, the actual code rate of 4 block puncturing in 64 subcarriers is the same as the actual code rate of 32 block puncturing in 512 sub-carriers.

Figure 5:
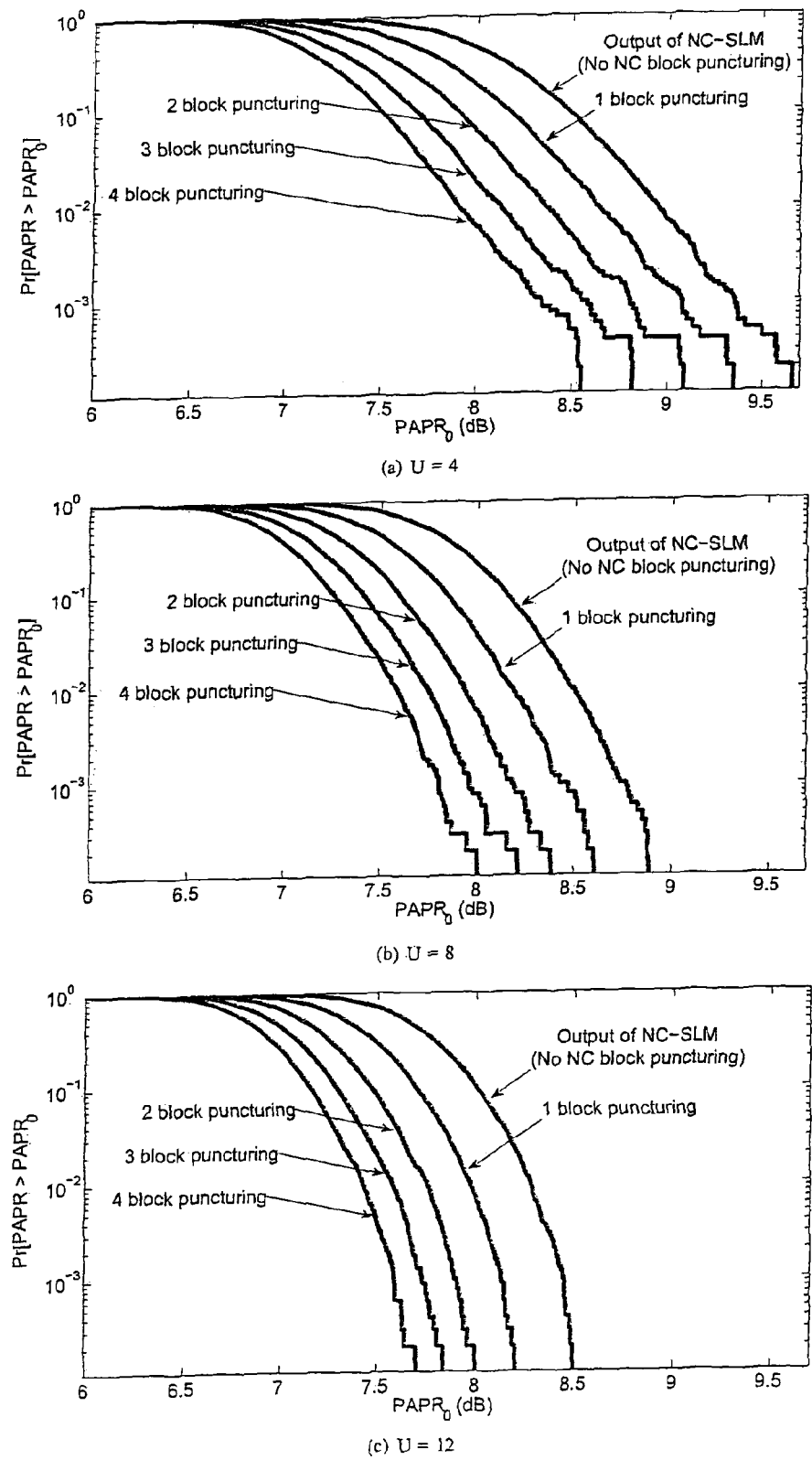
FIG. 5 shows a PAPR CCDF performance of the NC block puncturing without NC-SLM for 16 QAM-64 OFDM signals.

FIG. 5 compares the PAPR reduction that can be achieved by the NC-SLM scheme with block puncturing, for different values of U. It can be seen that only puncturing a small number of blocks can reduce the PAPR significantly.

In order to overcome the drawback of the PAPR metric as mentioned above, the proposed scheme of the present disclosure may use the CM. With the same simulation setting of the 16QAM-64OFDM signal, and for a code rate of ½, the performance evaluation results of RCM are shown in Table 1. From this table 1, it can be seen that the proposed scheme achieves a good performance when evaluated using the CM.

TABLE 1

| | Number of Puncturing Blocks | | | | |
|---|---|---|---|---|---|
| | 0 | 1 | 2 | 3 | 4 |
| U = 4 | 7.28 | 7.25 | 7.12 | 7.01 | 6.90 |
| U = 8 | 7.12 | 7.08 | 7.02 | 6.91 | 6.80 |
| U = 12 | 7.04 | 7.00 | 6.96 | 6.85 | 6.75 |

Figure 6:
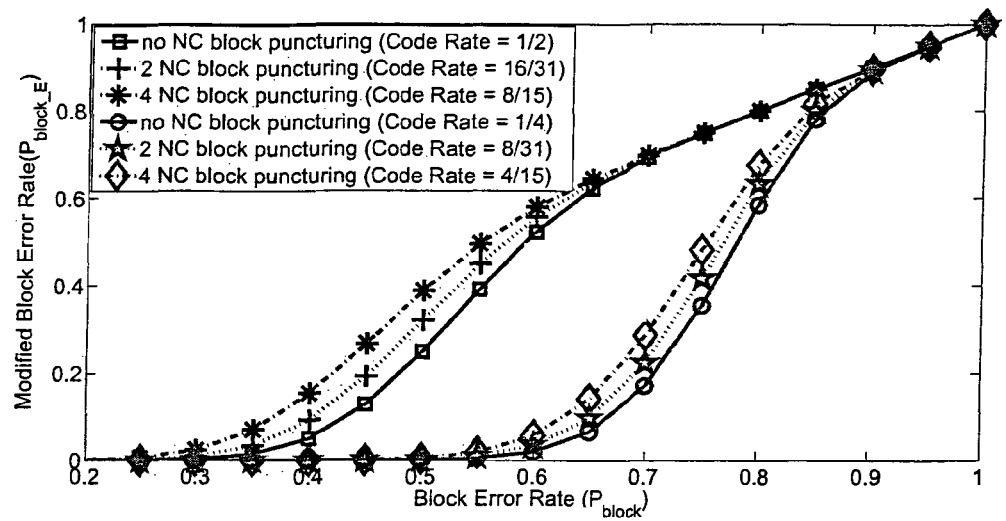
FIG. 6 shows a block error rate performance of block puncturing for 16 QAM-64 OFDM subcarrier signals.

FIG. 6 depicts the block error rate ($P_{loss\_E}$) performance as the number of punctured blocks increases for a 16QAM-64OFDM subcarrier system. We can see that the block error rate ($P_{loss\_E}$) increases with $N_p$, the number of punctured NC blocks. In the case of the un-punctured code rate 1/2 , the actual code rates become 16/31 and 8/15 for $N_p$=2 and 4, respectively. Similarly, for the un-punctured code rate ¼, the actual code rates are 8/31 and 4/15 for $N_p$=2 and 4, respectively. The impact of puncturing coded blocks can be minimized by dynamically changing the code rates, which is a favorable feature of rateless code. When the proposed block puncturing scheme is jointly used with the NC-SLM, large PAPR reduction can be achieved even with few blocks puncturing.

Figure 7:
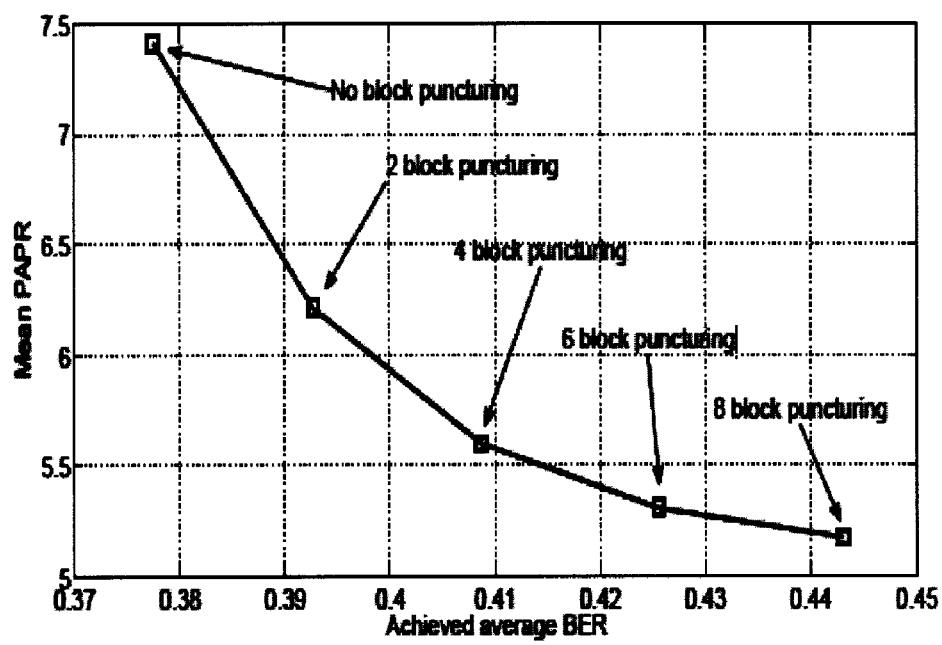
FIG. 7 shows an average block error rate and PAPR relationship for 16 QAM-64 OFDM subcarrier signals.

FIG. 7 shows that the proposed block puncturing scheme achieves better and better PAPR reduction as the number of punctured blocks increases. However, the PAPR reduction gain achieved with block puncturing gets smaller and smaller as the number of puncturing blocks increases. Therefore, the puncturing of the first few blocks is most efficient in terms of PAPR reduction.

The present disclosure may provide a use of network coding to jointly reduce the PAPR/CM and BLER in multicarrier (OFDM) signals. The proposed scheme is able to work with both PAPR and CM. The proposed algorithm both satisfies the conditions required for achieving minimum BLER and reducing PAPR/CM simultaneously. By utilizing a favorable randomization property of network coding, the proposed NC-SLM algorithm has been introduced. Moreover, it is proposed that an NC block puncturing step on top of the proposed NC-SLM scheme for further PAPR/CM reduction.

As described above, simulation results confirmed that the NC-SLM scheme already achieves the same PAPR reduction performance as the C-SLM. Adding the NC block puncturing step to the NC-SLM scheme makes it outperform the C-SLM PAPR reduction scheme. The effect of block puncturing on the block error rates is also described. The Simulations also show that substantial PAPR/CM reduction gains can be achieved with puncturing few blocks (as few as one block). Moreover, the present disclosure may provide a suggestion of the use of the NC block puncturing as a supplementary step, if the desired PAPR/CM is not achieved by the NC-SLM. By utilizing the proposed scheme of the present disclosure, mobile devices will be able to enjoy both the benefits of network coding in multicarrier systems and the reduction of PAPR, which allows a better use of power amplifiers.

The present discloses may provide a method of transmitting data in wireless communication system, the method comprising: dividing an input bit stream into segments; adding error detection code into each segments of the divided input bit stream in order to generate a packet; dividing the generated packet into a plurality of blocks with fixed size; coding each of the plurality of block using a coefficient matrix in order to generate coded block bits, and transmitting the coded block bits, wherein the coded block bits are mapped to one of modulation symbols, the coefficient matrix is defined to guarantee a non-singularity of any K of its columns, the all steps are implemented in an IEEE 802.16, a 3GPP LTE, or a 3GPP LTE-A, and the all steps are performed to reduce at least one of a peak-to-average power ratio (PAPR), a cubic metric (CM) and a block error rate (BLER).

It can be also said that the present disclosure may provide a method for transmitting data in wireless communication system, the method comprising: dividing an input bit stream into segments; adding error detection code into each segments of the divided input bit stream in order to generate a packet; dividing the generated packet into a plurality of blocks with fixed size; coding the plurality of blocks using a random network coding in order to generate a plurality of coded blocks; puncturing at least one coded block among the plurality of coded blocks; and transmitting the plurality of coded blocks, comparing a peak-to-average power ratio (PAPR) of different sets of coded blocks including a punctured coded blocks and non-punctured coded blocks, selecting a set of coded blocks having a minimum PAPR, wherein the at least one punctured coded block is mapped to at least one multi-carrier, the at least one punctured coded block is mapped to the at least one multi-carrier by allocating the at least one multi-carrier with a power of zero, and the all steps are implemented in an IEEE 802.16, a 3GPP LTE, or a 3GPP LTE-A.

Although the present disclosure is described in the context of mobile communications, the present disclosure may also be used in any wireless communication systems using mobile devices, such as PDAs and laptop computers equipped with wireless communication capabilities (i.e. interface). Moreover, the use of certain terms to describe the present disclosure is not intended to limit the scope of the present disclosure to a certain type of wireless communication system. The present disclosure is also applicable to other wireless communication systems using different air interfaces and/or physical layers, for example, TDMA, CDMA, FDMA, WCDMA, OFDM, EV-DO, Wi-Max, Wi-Bro, etc.

The exemplary embodiments may be implemented as a method, apparatus or article of manufacture using standard programming and/or engineering techniques to produce software, firmware, hardware, or any combination thereof. The term "article of manufacture" as used herein refers to code or logic implemented in hardware logic (e.g., an integrated circuit chip, Field Programmable Gate Array (FPGA), Application Specific Integrated Circuit (ASIC), etc.) or a computer readable medium (e.g., magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium may be accessed and executed by a processor. The code in which exemplary embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Of course, those skilled in the art will recognize that many modifications may be made to this configuration without departing from the scope of the present disclosure, and that the article of manufacture may comprise any information bearing medium known in the art.

As the present disclosure may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A method of a wireless transmitter transmitting data in wireless communication system, the method comprising:
dividing, by the wireless transmitter, an input bit stream into segments;
generating, by the wireless transmitter, a packet by adding error detection code into each of the segments;
dividing, by the wireless transmitter, the packet into a plurality of blocks with fixed size;
coding, by the wireless transmitter, the plurality of blocks using random network coding including a coefficient matrix A having a non-singularity in its columns,
wherein the coefficient matrix A is used for concurrently reducing both a peak-to-average power ratio (PAPR) and a block error rate (BLER) and is defined as follows:

$$A = \begin{pmatrix} 1 & 0 & \cdots & 0 & v_1 & v_2 & \cdots & v_{N-K} \\ 0 & 1 & \cdots & 0 & v_1^2 & v_2^2 & \cdots & v_{N-K}^2 \\ \vdots & \vdots & \ddots & \vdots & \vdots & \vdots & \vdots & \vdots \\ 0 & 0 & \cdots & 1 & v_1^K & v_2^K & \cdots & v_{N-K}^K \end{pmatrix},$$

wherein v1, v2 ... $v_{N-K}$ are vectors, v1≠v2, N is a number of coded blocks associated with K blocks of the input bit stream that can be transmitted over one orthogonal frequency division multiplexing (OFDM) symbol after block encoding, n is a number of bits per block, K is a total number of rows, N-K is a total number of columns, and $2^n - 2 \geq N-K$, and
wherein the coefficient matrix A is pre-stored in the wireless transmitter and a wireless receiver;
determining whether to perform a puncturing, wherein it is determined to perform the puncturing if the PAPR does not satisfy a desired value and if the BLER is small enough to satisfy a target value;
puncturing, by the wireless transmitter, a number of coded blocks selected from among the plurality of coded blocks to be punctured, the number being a minimum number of punctured coded blocks needed to satisfy the desired value, thereby maximizing a reduction of PAPR, when it is determined to perform the puncturing;
mapping, by the wireless transmitter, the plurality of coded blocks including the selected number of punctured coded blocks to multiple OFDM subcarriers; and
transmitting, by the wireless transmitter, the plurality of coded blocks on the multiple OFDM subcarriers to the wireless receiver.

2. The method of claim 1, further comprising:
comparing, by the wireless transmitter, PAPR of different sets of coded blocks including punctured coded blocks and non-punctured coded blocks; and
selecting, by the wireless transmitter, a set of coded blocks having a minimum PAPR.

3. The method of claim 1, further comprising:
allocating, by the wireless transmitter, a power of zero to at least one of the multiple OFDM subcarriers to which the selected number of punctured coded blocks is mapped.

4. A wireless transmitter, comprising:
a memory configured to store instructions for transmitting data in a wireless communication system; and
a processor coupled to the memory and configured to:
divide an input bit stream into segments,
generate a packet by adding error detection code into each of the segments,
divide the packet into a plurality of blocks with fixed size,
code the plurality of blocks using random network coding including a coefficient matrix A having a non-singularity in its columns,
wherein the coefficient matrix A is pre-stored in the wireless transmitter and a wireless receiver,
wherein the coefficient matrix A is used for concurrently reducing both a peak-to-average power ratio (PAPR) and a block error rate (BLER) and is defined as follows:

$$A = \begin{pmatrix} 1 & 0 & \cdots & 0 & v_1 & v_2 & \cdots & v_{N-K} \\ 0 & 1 & \cdots & 0 & v_1^2 & v_2^2 & \cdots & v_{N-K}^2 \\ \vdots & \vdots & \ddots & \vdots & \vdots & \vdots & \vdots & \vdots \\ 0 & 0 & \cdots & 1 & v_1^K & v_2^K & \cdots & v_{N-K}^K \end{pmatrix},$$

and
wherein v1, v2 ... $v_{N-K}$ are vectors, v1≠v2, N is a number of coded blocks associated with K blocks of the input bit stream that can be transmitted over one orthogonal frequency division multiplexing (OFDM) symbol after block encoding, n is a number of bits per block, K is a total number of rows, N-K is a total number of columns, and $2^n-2 \geq N-K$, determine whether to perform a puncturing, wherein it is determined to perform the puncturing if the PAPR does not satisfy a desired value and if the BLER is small enough to satisfy a target value, puncture a number of coded blocks selected from among the plurality of coded blocks to be punctured, the number being a minimum number of punctured coded blocks needed to satisfy the desired value, thereby maximizing a reduction of PAPR, when it is determined to perform the puncturing, map the plurality of coded blocks including the selected number of punctured coded blocks to multiple OFDM subcarriers, and transmit the plurality of coded blocks on the multiple OFDM subcarriers to the wireless receiver.

5. The wireless transmitter of claim 4, wherein the processor is further configured to:

compare PAPR of different sets of coded blocks including punctured coded blocks and non-punctured coded blocks; and select a set of coded blocks having a minimum PAPR.

6. The wireless transmitter of claim 4, wherein the processor is further configured to:

allocate a power of zero to at least one of the multiple OFDM subcarriers to which the selected number of punctured coded blocks is mapped.

* * * * *